United States Patent [19]

Tomioka et al.

[11] Patent Number: 5,355,023
[45] Date of Patent: Oct. 11, 1994

[54] SEMICONDUCTOR DEVICE HAVING CONDUCTING LAYERS CONNECTED THROUGH CONTACT HOLES

[75] Inventors: Yugo Tomioka; Yukihiro Okeda; Yasuo Sato, all of Sagamihara, Japan

[73] Assignee: Nippon Steel Corporation, Tokyo, Japan

[21] Appl. No.: 68,185

[22] Filed: May 28, 1993

[30] Foreign Application Priority Data

Jun. 5, 1992 [JP] Japan .................................. 4-171911

[51] Int. Cl.$^5$ ...................... H01L 23/48; H01L 29/40
[52] U.S. Cl. ...................... 257/774; 257/668
[58] Field of Search .................. 257/774, 668

[56] References Cited

U.S. PATENT DOCUMENTS 4,916,521 4/1990 Yoshikawa et al. ............... 257/774

*Primary Examiner*—Andrew J. James
*Assistant Examiner*—Stephen D. Meier
*Attorney, Agent, or Firm*—Pollock, Vande Sande & Priddy

[57] ABSTRACT

A part of a polycrystalline silicon film forming a grounding line in a memory cell of a high-resistance load type SRAM, located immediately below a contact hole for connection between a polysilicon power supply line part and an aluminum power supply line part, is separated and isolated from the remaining part of the polycrystalline silicon film to form an island-like part. The contact hole extends through an interlayer insulating film below the aluminum power supply line part, the polysilicon power supply line part and another interlayer insulating film above the island part, and reaches the island part, whereby the aluminum power supply line part contacts even the island part through the contact hole. The island part also contacts the polysilicon power supply line part through another contact hole, whereby low-resistance contact can be obtained between the aluminum and polysilicon power supply line parts through the island part. Since the contact hole can be provided at a position above a grounding line, the area of the cell can be reduced. In this case, even when the contact hole reaches the polycrystalline silicon film of the grounding line due to difficulties in its etching control, undesirable short-circuiting can be avoided between the grounding and power supply lines.

10 Claims, 5 Drawing Sheets

SEMICONDUCTOR DEVICE HAVING CONDUCTING LAYERS CONNECTED THROUGH CONTACT HOLES

FIELD OF THE INVENTION

The present invention relates to semiconductor devices in which conducting layers are connected through contact holes and more particularly, to a semiconductor device which can be suitably applied to a high-resistance load type static random access memory (SRAM).

BACKGROUND OF THE INVENTION

In a prior art integrated semiconductor device having multiple conducting layers it has been difficult to establish proper wiring between target conducting layers. For example, with a high-resistance load type SRAM, resistance elements and power supply lines are made of polycrystalline silicon films within a memory cell array and are wired through contact holes at the boundary of the array with electric wire parts made of metal films such as aluminum films located outside the memory cell array.

However, this type of SRAM has been defective in that, when the polycrystalline silicon film is made thin for the purpose of obtaining a high resistance, the contact holes may often be made penetrating the film, which results in short-circuiting between the power supply and grounding lines where the contact holes are formed on the grounding lines.

FIG. 7 shows an equivalent circuit of an exemplary high-resistance, 4-transistor cell of an SRAM. This memory cell 11 has a flip-flop 12 which comprises a pair of inverters 13 and 14 having inputs and outputs wired in cross connection. The inverters 13 and 14 are made up of driver transistors 15, 16 and load resistor elements 17, 18 respectively. Additional transferring transistors 21 and 22 form the memory cell 11 together with the above flip-flop 12.

The transistors 15 and 16 are connected at their sources to a common grounding line 23, while the resistor elements 17 and 18 are connected to a common power supply line 24. The transistors 21 and 22 are connected at their gates to a common word line 25, and also connected at ones of their sources and drains to bit lines 26 and 17.

The resistor elements 17 and 18 are generally made of a high-resistance polycrystalline silicon film, and the power supply line 24 within the memory cell array is made by lowering the resistance of the corresponding part of the same polycrystalline silicon film as the resistor elements 17 and 18. For the purpose of minimizing the standby current of the cell array and thereby reducing its power consumption by increasing the resistance values of the resistor elements 17 and 18, it is common practice to make thin the polycrystalline silicon film of the resistor elements 17 and 18 as about 50 nm.

As further shown in FIG. 8, the power supply line 24 usually has a power supply line part 24a made of a polycrystalline silicon film within the memory cell array and also has another power supply line part 24b made of a metallic film as an aluminum film outside the memory cell array. Therefore, as shown in FIGS. 8 and 9, these power supply line parts 24a and 24b are contacted with each other through a contact hole 31, at the boundary between the outside and inside of the memory cell array.

With the SRAM having an arrangement as mentioned above, usually, the gate electrodes of the transistors 13 and 14 and the word line 25 are made of a polycrystalline silicon film as the first layer, the grounding line 23 is made of a polycrystalline silicon as the second layer, and the resistor elements 17 and 18 and the power supply line part 24a are made of a polycrystalline silicon film as the third layer on a semiconductor substrate.

Furthermore, for the purpose of decreasing the area of the memory cell to thereby increase its integration density, in one method, the contact hole 31 between the power supply line parts 24a as the third layer and the power supply line parts 24b is made immediately above the grounding line 23 of the polycrystalline silicon film of the second layer as shown in FIG. 8.

As already mentioned above, the polycrystalline silicon film of the third layer is about 50 nm thin. The contact hole 31 is made by etching an interlayer insulating film (made of $SiO_2$ in most cases) disposed between the power supply line parts 24a and 24b to electrically connect the line parts 24a and 24b as shown in FIG. 9. However, when the contact hole 31 is made, the polycrystalline silicon film of the power supply line part 24a may fail to function as an etching stopper, with the result that the contact hole 31 undesirably penetrates even the power supply line part 24a.

In addition, since the interlayer insulating film 33 between the power supply line part 24a and grounding line 23 is usually made of an $SiO_2$ film, when the contact hole 31 is made through the power supply line part 24a, the contact hole 31 is also extended through the interlayer insulating film 33 and often reaches even the grounding line 23, as shown by dotted lines in FIG. 9.

Under such a condition, when the power supply line part 24b is formed, this causes the power supply line part 24b to be contacted even with the grounding line 23 through the contact hole 31, thus disadvantageously resulting in that short-circuiting takes place between the power supply and grounding lines 24 and 23.

In order to eliminate such a disadvantage, such a highly difficult technology is required to control the etching process to prevent the contact hole 31 from reaching the grounding line 23.

SUMMARY OF THE INVENTION

It is therefore an object of the present invention to provide a semiconductor device in which, even when a contact hole for contacting with only an upper wiring layer is made penetrating through the upper wiring layer and reaching even a lower wiring layer, short-circuiting between the upper and lower wiring layers can be avoided.

In accordance with an aspect of the present invention, the above object is attained by providing a semiconductor device which comprises a first conducting layer, a first insulating layer covering the first conducting layer, a second conducting layer positioned on the first insulating layer to have a first overlap part overlapped with the first conducting layer as viewed from top, a second insulating layer covering the second conducting layer, a third conducting layer positioned on the second insulating layer and having a second overlap part overlapped with the first overlap part as viewed from top, a contact hole made in the second insulating layer at a position corresponding to the second overlap part, and an isolated conductive island insulated from other part of the first conducting layer being formed in the layer located at a position corresponding to the contact hole, and in which the second conducting layer is electrically connected to the third conducting layer through the contact hole.

In accordance with another aspect of the present invention, there is provided a semiconductor device which further comprises a second contact hole made in the first insulating layer at a position corresponding to the first overlap part but different from the contact hole, and wherein the isolated conductive island is provided at a part further enclosing a position corresponding to the second contact hole, and the isolated conductive island is electrically connected to the second conducting layer through the second contact hole.

In this case, the first and second conducting layers, respectively, are, for example made of polycrystalline semiconductor material.

In the semiconductor device of the present invention, during formation of the contact hole in the second insulating layer between the second and third conducting layers, even when the contact hole is extended through the second conducting layer and reaches the first conducting layer, short-circuiting can be prevented from taking place between the major part of the first conducting layer and the second or third conducting layer, since that part of the first conducting layer formed therein as an isolated island at a position of the contact hole is separated from the other remaining part of the first conducting layer.

With the semiconductor device of the second embodiment of the invention, since the isolated conductive island is further connected to the second conducting layer through the second contact hole, when the first contact hole is extended up to the isolated conductive island to thereby cause electrical short-circuiting between the third conducting layer and isolated conductive island, interconnection between the third and second conducting layers can be reliably established.

DESCRIPTION OF THE PREFERRED EMBODIMENTS

Figure 7:
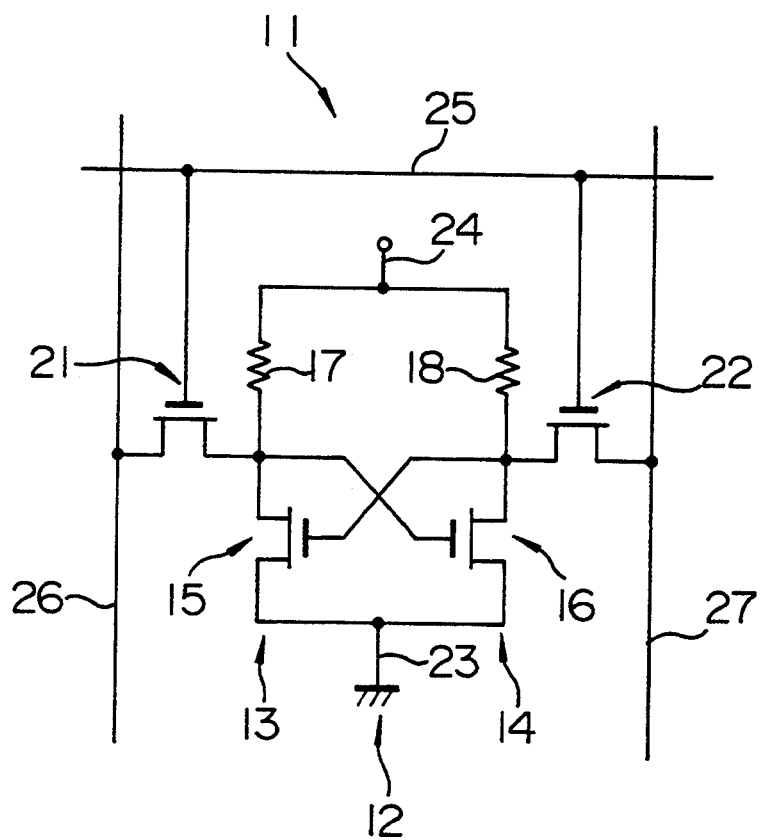
FIG. 7 is an equivalent circuit of a high-resistance load type 4-transistor memory cell in a prior art SRAM to which the present invention is to be applied.
Figure 8:
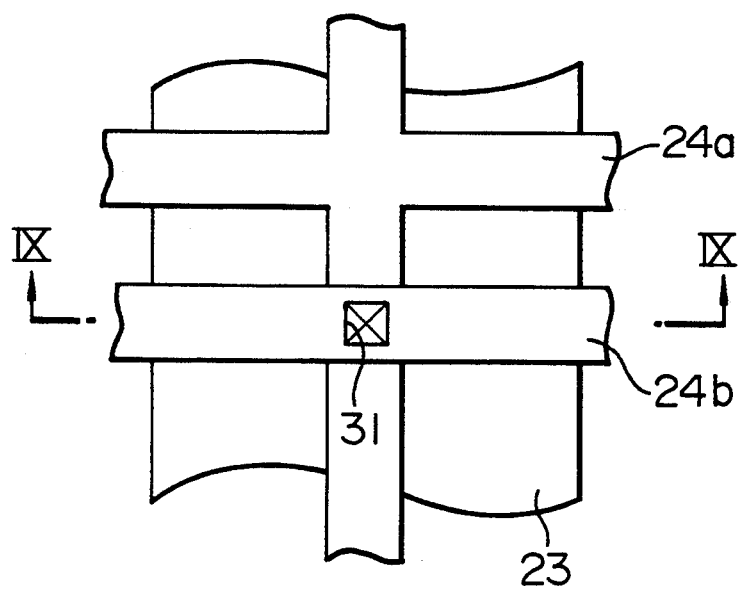
FIG. 8 is a plan view showing a contact hole structure in the prior art semiconductor device.

The present invention will be described in more detail referring to FIGS. 1 to 6 which show embodiments of the present invention applied to a high-resistance load type 4-transistor cell of an SRAM. In FIGS. 1 to 6, parts having the same reference as in FIGS. 7, 8 and 9 have the same structures.

Embodiments of the present invention shown in FIGS. 1 to 6 are directed to such structures formed on an insulating film provided on a polycrystalline silicon film as the first layer on a semiconductor substrate. Gate electrodes of transistors are formed in the first layer. A first conducting layer formed as a grounding line 23 on the above insulating film is made of a polycrystalline silicon film as the second layer on the substrate having a thickness of about 100–200 nm. The grounding line 23 may be made of a polycide film 200–300 nm thick and including a tungsten silicide film. A part of the power supply line 24 indicated by 24a which corresponds to the second wiring layer connected to resistor elements 17 and 18 within the memory cell array is made of a polycrystalline silicon film as the third layer on the semiconductor substrate having a thickness of about 50 nm. A part 24b of the power supply line 24 which corresponds to a third conducting layer provided outside the memory cell array is made of an aluminum film. The power supply line part 24a provided within the memory cell array is connected to the power supply line part 24b provided outside the memory cell array immediately outside the array through a contact hole. The contact hole itself is made in an interlayer insulating film above an isolated island 34 formed in the first wiring layer 23.

Figure 1:
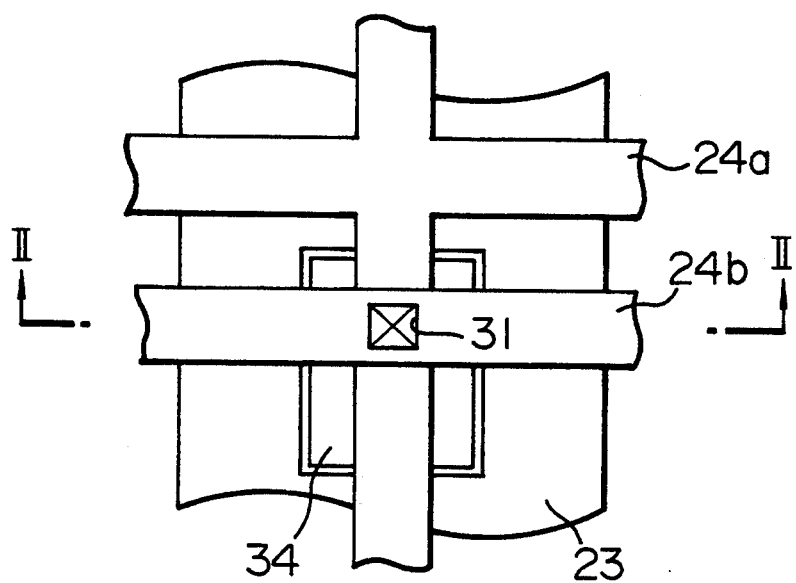
FIG. 1 is a plan view showing a contact hole region of a semiconductor device in accordance with a first embodiment of the present invention.
Figure 2:
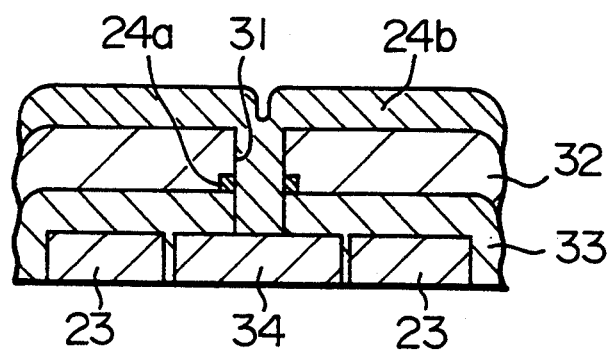
FIG. 2 is a cross-sectional view taken along line II—II in FIG. 1.

FIGS. 1 and 2 show a first embodiment of the present invention. In the first embodiment, an interlayer insulating film 32 disposed between the power supply line parts 24a and 24b is provided therein with the contact hole 31 which is positioned at a position corresponding to an overlapped part of the power supply line parts 24a and 24b above the isolated island 34. The power supply line part 24a is electrically connected to the power supply line part 24b through the contact hole 31.

A part of the second-layer polycrystalline silicon film of the grounding line 23 located immediately below the contact hole 31 is formed as the isolated island 34 separated from the other remaining part of the grounding line 23. The separation of the island-like part 34 from the other part of the grounding line 23 may be realized by subjecting the grounding line film 23 to a microprocessing based on a phase-shift photolithography.

And, as shown in FIG. 2, the contact hole 31, which is made in the interlayer insulating SiO$_2$ film 32 disposed between the power supply line part 24a of the third-layer polycrystalline silicon film and the power supply line part 24b of the aluminum film, is passed through the power supply line part 24a and further reaches the island part 34 located therebelow.

Figure 9:
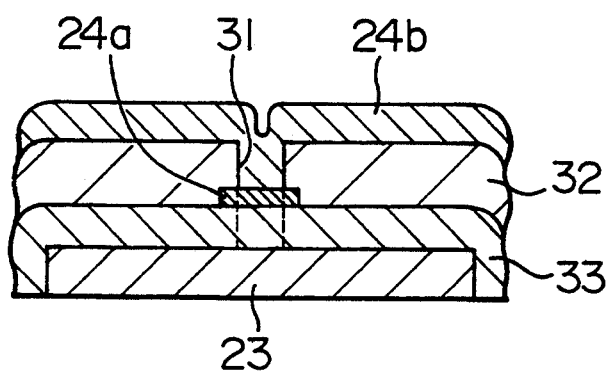
FIG. 9 is a cross-sectional view taken along line IX—IX in FIG. 8.

In other words, even in the present embodiment, since the polycrystalline silicon film of the power supply line part 24a is made as thin as about 50 nm, like the prior art shown in FIG. 9, the contact hole 31 formed by etching tends to pass through not only the interlayer insulating film 32 but also the power supply line part 24a and an interlayer insulating film 33 beneath the line part and to even reach the second-layer polycrystalline silicon film.

In the present embodiment, however, the island part 34 of the second-layer polycrystalline silicon film 23 immediately beneath the contact hole 31 is separated and spaced from the other remaining part of the grounding line film 23. For this reason, even when the power supply line part 24b is contacted by the second-layer polycrystalline silicon film through the contact hole 31, this will cause no short-circuiting between the power supply line 24 and grounding line 23.

There can occur such a case that the contact hole 31 fails to reach the second-layer polycrystalline silicon film depending on the etching conditions. It is preferable from the viewpoint of easy control of various conditions to control the etching process in such a manner that the contact hole 31 positively reaches the second-layer polycrystalline silicon film.

In the latter case, the contact between the power supply line parts 24a and 24b can be established only at part of the inner wall of the contact hole 31 as illustrated. Thus, the contact area between the power supply line parts becomes small and thus a contact resistance becomes high.

Figure 3:
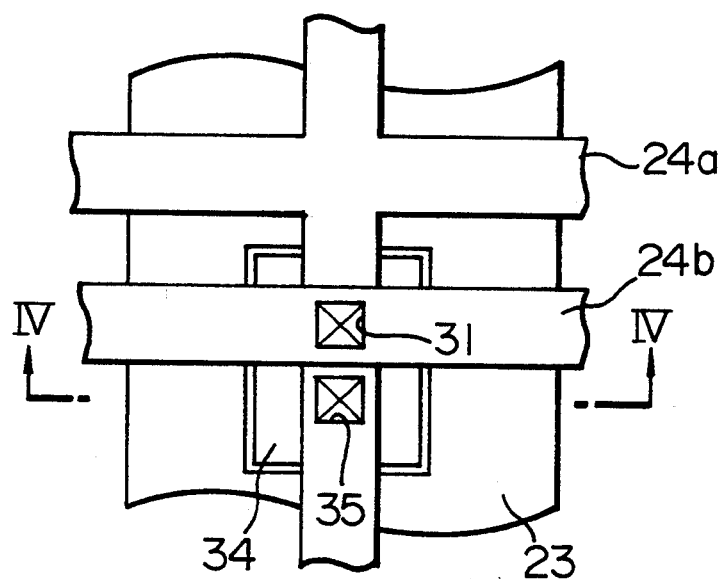
FIG. 3 is a plan view showing a contact hole region of a semiconductor device in accordance with a second embodiment of the present invention.
Figure 4:
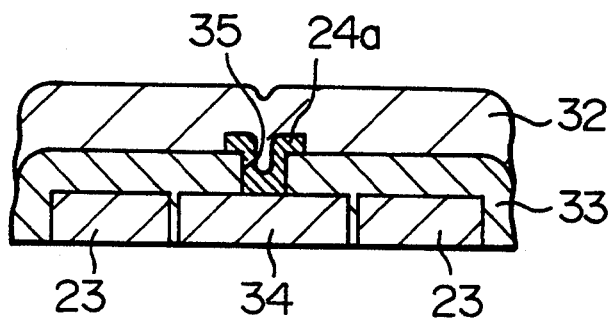
FIG. 4 is a cross-sectional view taken along line IV—IV in FIG. 3.

There is next shown a second embodiment of the present invention in FIGS. 3 and 4. In the present embodiment, an interlayer insulating film 33 is provided between a third-layer polycrystalline silicon film 33 as a power supply line part 24a and a second-layer polycrystalline silicon film as a grounding line 23, the interlayer insulating film 33 is provided therein, in addition to such a contact hole 31 as mentioned above, with another contact hole 35 which is positioned above an island-like part 34 so that the power supply line part 24a is contacted with the island part 34 through the contact hole 35. Thus, when the contact hole 31 is positively made so as to reach the second-layer polycrystalline silicon film, the power supply line part 24a can be electrically contacted with a power supply line part 24b through the island part 34 of the second-layer polycrystalline silicon film, with a sufficiently low contact resistance therebetween.

Figure 5:
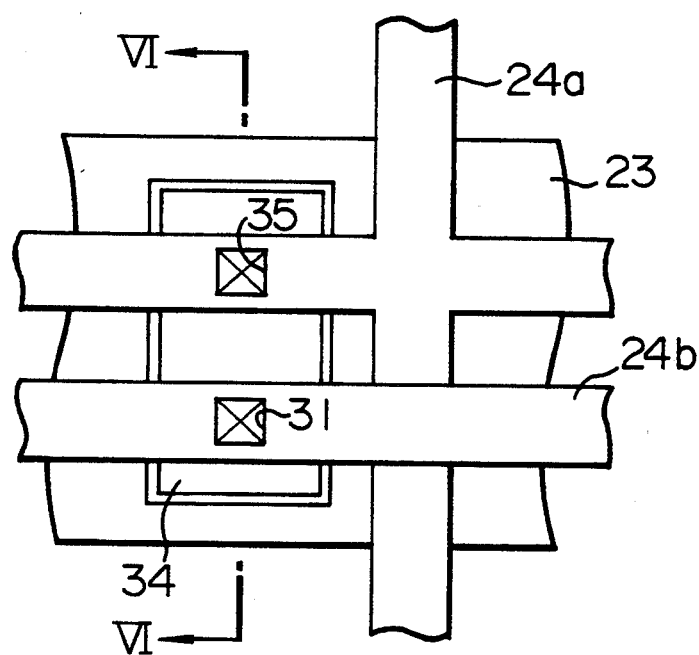
FIG. 5 is a plan view showing a contact hole region of a semiconductor device in accordance with a third embodiment of the present invention.
Figure 6:
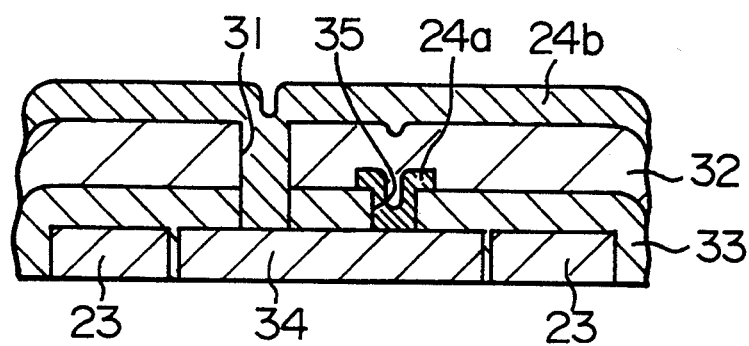
FIG. 6 is a cross-sectional view taken along line VI—VI in FIG. 5.

Shown in FIGS. 5 and 6 is a third embodiment of the present invention. In the present embodiment, a first contact hole 35 is made to extend through a first interlayer insulating layer 33 between a power supply line part 24a of a polycrystalline silicon film and an isolated conductive island 34, so that electrical interconnection between the power supply line part 24a and isolated conductive island 34 is established by means of the first contact hole 35. Further, a second contact hole 31 is made to extend both through a second interlayer insulating layer 32 between the power supply line part 24a and a power supply line part 24b of an aluminum film and through the first interlayer insulating layer 33, so that electrical interconnection between the power supply line part 24b and isolated conductive island 34 is established by means of the second contact hole 31. This enables the electrical interconnection between the power supply line parts 24a and 24b to be ensured through the isolated conductive island 34. The third embodiment can ensure more reliable electrical interconnection between the power supply line parts 24a and 24b as compared with the case of the direct interconnection therebetween, since a sufficient contact area can be obtained.

Further, when the second contact hole 31 is made to extend not only through the first and second interlayer insulating layers 33 and 32 but also through the power supply line part 24a, the contact area can be further increased and a contact resistance can be advantageously made small.

Although explanation has been made in connection with the embodiments in which the present invention is applied to the high-resistance 4-transistor cell of the SRAM, the present invention is not limited to the specific examples but may be applied even to other semiconductor devices having a multi-layer wiring structure.

As has been explained in the foregoing, in accordance with the semiconductor device of the present invention, during the formation of the contact hole in the second insulating layer between the second and third conducting layers, even when the contact hole is extended through the second wiring layer and reaches the first wiring layer located below the second one, short-circuiting can be reliably avoided between the the major part of the first conducting layer and the second and third conducting layers. As a result, control over various conditions during the formation of the contact hole can be relatively easily carried out, its manufacturing efficiency can be improved, and its yield can also be improved.

Since the contact hole between the power supply line parts can be provided at a position above the grounding line without causing any short-circuiting between the power supply and grounding lines, the SRAM can be fabricated with a high integration density and a good yield.

What is claimed is:

1. A semiconductor device comprising:
   a first conducting layer;
   a first insulating layer covering said first conducting layer;
   a second conducting layer positioned on said first insulating layer and having a first overlap part which is overlapped with said first conducting layer as viewed from the top;
   a second insulating layer covering said second conducting layer;
   a third conducting layer positioned on said second insulating layer and having a second overlap part which is overlapped with said first overlap part as viewed from the top;
   a contact hole made in said second insulating layer at a position corresponding to said second overlap part; and
   an isolated conductive island formed in said first conducting layer, so that an area of said isolated conductive island covers a sectional area of said contact hole and said isolated conductive island is electrically insulated from other parts with the exception of said contact hole, and
   wherein said second conducting layer is electrically connected to said third conducting layer through said contact hole.

2. The semiconductor device as set forth in claim 1, further comprising a second contact hole made in said first insulating layer at a position corresponding to said first overlap part and separated from said contact hole, and wherein said isolated conductive island further covers a sectional area of said second contact hole, and said isolated conductive island is electrically connected to said second conducting layer through said second contact hole.

3. The semiconductor device as set forth in claim 1, wherein said first and second conducting layers are respectively made of a polycrystalline semiconductor material.

4. The semiconductor device comprising:
   a first conducting layer;
   a first insulating layer covering said first conducting layer;
   a second conducting layer positioned on said first insulating layer and having a first overlap part which is overlapped with said first conducting layer as viewed from the top;
a second insulating film covering said second conducting layer;
a third conducting layer positioned on said second insulating layer and having a second overlap part which is overlapped with said first conducting layer as viewed from the top;
a first contact hole made in said first insulating layer at a position corresponding to said first overlap part;
a second contact hole made in said second insulating layer at a position corresponding to said second overlap part; and
an isolated conductive island formed in said first conducting layer, so that an area of said isolated conductive island covers a sectional area of said first and second contact holes and said isolated conductive island is electrically insulated from other parts except for said first and second contact holes,
wherein said isolated conductive island is electrically connected to said second conducting layer through said first contact hole and to said third conducting layer through said second contact hole.

5. The semiconductor device as set forth in claim 4, wherein said second overlap part includes a third overlap part which is overlapped with said first overlap part, and said second contact hole is located in said third overlap part and formed to extend through said first insulating layer, said second conducting layer and said second insulating layer.

6. The semiconductor device as set forth in claim 4, wherein said first and second conducting layers are respectively made of a polycrystalline semiconductor material.

7. A semiconductor device comprising:
a first conducting layer;
a first insulating layer covering said first conducting layer;
a second conducting layer positioned on said first insulating layer and having a first overlap part which is overlapped with said first conducting layer as viewed from the top;
a second insulating layer covering said second conducting layer;
a third conducting layer positioned on said second insulating layer and having a second overlap part which is overlapped with said first overlap part as viewed from the top;
a contact layer for electrically connecting to said second conducting layer and said third conducting layer, made in said second insulating layer at a position corresponding to said second overlap part, and
an isolated conductive island formed in said first conducting layer, so that an area of said isolated conductive island covers a sectional area of said contact layer and said isolated conductive island is electrically insulated from other parts except for said contact layer.

8. The semiconductor device as set forth in claim 7, further comprising a second contact layer made in said first insulating layer at a position corresponding to said first overlap part and separated from said contact layer, and wherein said isolated conductive island is located at said part further enclosing a position corresponding to said second contact layer further covers a sectional area of said second contact layer, and said isolated conductive island is electrically connected to said second conducting layer through said second contact layer.

9. The semiconductor device as set forth in claim 7, wherein said first and second conducting layers are respectively made of a polycrystalline semiconductor material.

10. The semiconductor device as set forth in claim 7, wherein said isolated conductive island is electrically connected to said second conducting layer through said contact layer.

* * * * *